United States Patent [19]

Osada et al.

[11] Patent Number: 5,086,333
[45] Date of Patent: Feb. 4, 1992

[54] SUBSTRATE FOR SEMICONDUCTOR APPARATUS HAVING A COMPOSITE MATERIAL

[75] Inventors: Mituo Osada; Yoshinari Amano; Nobuo Ogasa; Akira Ohtsuka, all of Itami, Japan

[73] Assignee: Sumitomo Electric Industries, Ltd., Osaka, Japan

[21] Appl. No.: 382,056

[22] Filed: Jul. 13, 1989

Related U.S. Application Data

[63] Continuation of Ser. No. 90,392, Aug. 27, 1987, abandoned, which is a continuation of Ser. No. 831,124, Feb. 21, 1986, abandoned, which is a continuation of Ser. No. 515,890, Jul. 21, 1983, abandoned.

[30] Foreign Application Priority Data

Jul. 26, 1982 [JP] Japan .................. 57-131026

[51] Int. Cl.$^5$ .............................. H01L 29/62
[52] U.S. Cl. ........................... 357/67; 357/45
[58] Field of Search .................. 357/67, 45, 71

[56] References Cited

U.S. PATENT DOCUMENTS

| | | | |
|---|---|---|---|
| 3,097,329 | 7/1963 | Siemens | 357/81 |
| 3,204,158 | 8/1965 | Schreiner et al. | 357/67 |
| 3,969,754 | 7/1976 | Kuniya et al. | 357/67 |
| 4,196,442 | 4/1980 | Kuniya et al. | 357/67 |
| 4,427,993 | 1/1984 | Fichot | 357/67 |
| 4,680,618 | 7/1987 | Kuroda et al. | 357/74 |

OTHER PUBLICATIONS

"New Low-Expansion Alloys for Semiconductor Applications"—Kosco—Solid State Technology, Jan. 1969, pp. 47-49.

*Primary Examiner*—Frank Gonzalez
*Attorney, Agent, or Firm*—Wenderoth, Lind & Ponack

[57] ABSTRACT

This invention relates to a substrate for mounting a semiconductor chip in an integrated circuit wherein a sintered compact containing copper at 2 to 30 wt. % and tungsten and/or molybdenum is employed as a substrate which efficiently radiates heat developed from the semiconductor chip mounted thereon and said substrate having a thermal expansion coefficient similar to those of semiconductor chip and other enclosure materials.

8 Claims, No Drawings

SUBSTRATE FOR SEMICONDUCTOR APPARATUS HAVING A COMPOSITE MATERIAL

This application is a continuation of now abandoned application Ser. No. 07/090,392 filed on Aug. 27, 1987 which is a continuation of now abandoned Ser. No. 06/831,124 filed Feb. 21, 1986 which is a continuation of now-abandoned Ser. No. 06/515,890 filed July 21, 1983.

This invention relates to a substrate for mounting a semiconductor chip used in an integrated circuit or the like. An object of the invention is to provide a superior substrate for mounting the semiconductor chip, which substrate is capable of efficiently radiating heat developed from the mounted semiconductor chip and said substrate having a thermal expansion coefficient similar to those of semiconductor chip and other materials surrounding the same.

Substrate for loading semiconductor chips have conventionally been made of a Ni alloy consisting of Kovar (29% Ni-17% Co-Fe), 42 alloy; etc, or ceramics, such as alumina, forsterite, etc.

Conventional substrates have thermal expansion coefficients similar to that of the semiconductor chip, and when high heat radiation is also required, various Cu alloys have been used.

However, recent remarkable progress in the semiconductor industry has promoted greater size of semiconductor chips or increased amounts of heat generation and the demand for a substrate material to meet both the characteristics of thermal expansion coefficient and heat radiation has been on the increase.

Under such conditions, tungsten, molybdenum, beryllia, etc., have been proposed as materials to meet both of the above characteristics.

Beryllia, however, in fact, is not usable from the standpoint of environmental pollution. Although the thermal expansion coefficient of tungsten or beryllia is corresponds well to that of the semiconductor chip, it has a large difference from that of alumina often used as the enclosure material and also from that of GaAs which has recently been used in increasing amounts for semiconductor chips. Furthermore, tungsten and molybdenum are inferior to beryllia in respect of heat radiation so as to be largely restricted in packaging design.

The inventors, after conducting research on elimination of the above defects in materials for conventional substrates for mounting semiconductor chips to thereby control the thermal expansion coefficient and obtain the substrate material of good heat conductivity, have arrived at the present invention.

In other words, the semiconductor chip bearing substrate of the present invention has thermal expansion coefficient similar to those of semiconductor chips and enclosure materials, is superior in heat conductivity. It comprises a sintered compact containing copper at 2 to 30% and a tungsten and/or molybdenum.

When electrical-insulation is required, the substrate is given a thin-layer surface coating of a ceramic or organic insulator, instead of conventional ceramic.

In this invention, there is employed Cu in the amount of 2 to 30 wt. % and in a matrix W and/or Mo matrix to obtain a thermal expansion coefficient of the substrate as similar as possible to those of Si and GaAs or sintered alumina or other enclosure materials, thereby reducing, to the extent possible, the influence of stress caused by the mismatch between the thermal expansion coefficients of the substrate and semiconductor chip and enclosure material. Hence, a proper amount of Cu need only be selected in the above range corresponding to the formation and size of the package.

The inventive substrate containing Cu and W and/or Mo is produced by powder metallurgy, because the manufacture of the same by the melting method is difficult due to the melting point and specific gravity difference of between Cu, W and Mo. Among the powder metallurgy methods, sintering and infiltration are preferable.

Also, it is possible to make the W and/or Mo skeleton by adding thereto an iron group element at 20 wt. % or less.

A preferred amount of iron group element to be added is below 5 wt. %, but even above that, when up to 20 wt. %, will form the skeleton.

The addition of an amount over 20 wt. %, however, is not preferred because the sintered compact produced is defective in the thermal characteristic and thus will not attain the objects of the invention.

The amount of iron group element, even when added to both W and Mo, can be added to W or Mo independently.

As seen from the above, the substrate of the invention can meet the increasing demand for large and high density semiconductor chips and be applicable as a substrate for the GaAs chip which is being put into practical use together with an Si chip.

Next, embodiments of the invention will be detailed as follows.

EXAMPLE 1

Tungsten and a powder mixture of the same and an iron group element were compacted in the size of 100×100×5 mm respectively, and sintered under an the $H_2$ atomsphere at a temperature of 1000° to 1400° C., thereby obtaining an intermediate sintered compact with porosity of 1 to 5%. Cu was infiltrated into the sintered compact under the $H_2$ gas atmosphere at a temperature of 1200° C. to produce Cu-W alloy of Cu content of 1 to 40 wt. %.

Cu-W alloy thus produced was measured for thermal expansion coefficient and thermal conductivity to obtain the results in Table 1.

In addition, the thermal expansion coefficients of $Al_2O_3$, Si, and GaAs were entered therein.

The marks * in Table 1 represent comparative examples outside the scope of the invention.

TABLE 1

| No. | Alloy Composition | Thermal Expansion Coefficient ($\times 10^{-6}$/°C.) | Thermal Conductivity (cal/cm · sec · °C.) |
|---|---|---|---|
| 1* | 1Cu—99W | 4.7 | 0.40 |
| 2 | 5Cu—95W | 5.2 | 0.45 |
| 3 | 10Cu—90W | 7.0 | 0.50 |
| 4 | 15Cu—85W | 7.9 | 0.54 |
| 5 | 20Cu—80W | 8.3 | 0.58 |
| 6 | 25Cu—75W | 9.0 | 0.62 |
| 7 | 30Cu—70W | 9.7 | 0.65 |
| 8* | 35Cu—65W | 11.0 | 0.69 |
| 9* | 40Cu—60W | 11.8 | 0.73 |
| 10 | 10Cu—89W—1Ni | 7.0 | 0.48 |
| 11 | 20Cu—79.5W—0.5Ni | 8.2 | 0.57 |
| 12 | 5Cu—80W—15Fe | 7.9 | 0.42 |
| 13 | 10Cu—79W—11Co | 8.1 | 0.46 |
| 14* | $Al_2O_3$ | 7.2 | |
| 15* | Si | 4.0 | |
| 16* | GaAs | 6.7 | |

In the above table, an IC package using a Cu-W alloy sintered compact (No. 3) Cu content of 10 wt. % as the substrate material for mounting an Si chip produced no heat distortion due to a small difference between the thermal expansion coefficients of the Si chip and other enclosure base material made of $Al_2O_3$ during the mounting process and an extremely good heat radiation as the device could produce an IC longer in life span and of high reliability.

EXAMPLE 2

Molybdenum and a powder mixture of the same and iron group element were compacted to the size of 100×100×5 mm respectively, and then were sintered under an $H_2$ gas atmosphere at a temperature of 1000° to 1400° C., thereby obtaining an intermediate sintered compact with a porosity of 1 to 50%.

Copper was infiltrated into the intermediate sintered compact under an $H_2$ gas atmosphere at a temperature of 1200° C., thereby producing Cu-Mo alloy of copper content of 1 to 50 wt. %.

The Cu-Mo alloy thus produced was measured for the thermal expansion coefficient and heat conductivity, thereby having obtained the results in Table 2.

In addition, the marks * represent comparative examples outside the scope of the invention.

TABLE 2

| No. | Alloy Composition | Thermal Expansion Coefficient ($\times 10^{-6}$/°C.) | Thermal Conductivity (cal/cm · sec · °C.) |
|---|---|---|---|
| 1* | 1Cu—99Mo | 5.3 | 0.35 |
| 2 | 5Cu—95Mo | 5.9 | 0.38 |
| 3 | 10Cu—90Mo | 6.5 | 0.41 |
| 4 | 15Cu—85Mo | 7.1 | 0.44 |
| 5 | 20Cu—80Mo | 7.9 | 0.48 |
| 6 | 25Cu—75Mo | 8.4 | 0.50 |
| 7 | 30Cu—70MO | 9.1 | 0.54 |
| 8* | 35Cu—65Mo | 9.7 | 0.57 |
| 9* | 40Cu—60Mo | 10.3 | 0.60 |
| 10* | 50Cu—50Mo | 11.5 | 0.66 |
| 11 | 10Cu—89.5Mo—0.5Ni | 6.5 | 0.39 |
| 12 | 15Cu—82.0Mo—3.0Ni | 7.2 | 0.41 |
| 13 | 5Cu—78Mo—17Fe | 8.2 | 0.36 |
| 14 | 10Cu—82Mo—8Co | 7.8 | 0.40 |

In the above Table 2, an IC package using a Cu-Mo alloy sintered compact (No. 4) as the substrate base material for mounting the Si chip produced no heat distortion at all due to a small difference between the thermal expansion coefficients of the Si chip and other enclosure base materials made of $Al_2O_3$ during the mounting process and extremely good heat radiation, and as the device can obtain an IC longer in life span and of high reliability.

EXAMPLE 3

Tungsten, molybdenum powder or tungsten-molybdenum alloy powder and the required amounts of copper powder and iron group powder were mixed as shown in Table 3, and the powder was mixed by an attrition mixer uniformly for three hours, compacted to the size of 30×30×5 mm under pressure of 1 t/cm², and then sintered under the $H_2$ gas atmosphere at a temperature of 1450° C. for one hour.

The alloy thus produced was measured for thermal expansion coefficient and heat conductivity, with the results being set forth in Table 3. In addition, in Table 3, the marks * represent the comparative examples outside the scope of the invention.

TABLE 3

| No. | Alloy Composition | Thermal Expansion Coefficient ($\times 10^{-6}$/°C.) | Thermal Conductivity (cal/cm · sec · °C.) |
|---|---|---|---|
| 1 | 15Cu—85W | 8.2 | 0.50 |
| 2 | 20Cu—79W—1Ni | 8.5 | 0.48 |
| 3 | 20Cu—75W—5Co | 8.7 | 0.47 |
| 4 | 30Cu—68W—2Fe | 9.9 | 0.50 |
| 5 | 20Cu—70W—10Mo | 8.5 | 0.54 |
| 6* | 35Cu—65W | 11.5 | 0.61 |

What is claimed is:

1. A substrate for a semiconductor apparatus for loading a semiconductor chip, consisting essentially of a material containing copper and at least one of tungsten and molybdenum, said material being produced by pressing and sintering at least one of tungsten and molybdenum powders to form a sintered compact, said sintered compact being infiltrated with molten copper at 10–30 weight percent, the thermal expansion coefficient of said substrate being in the range of 5.2 to $9.7 \times 10^{-6}$/°C. and the thermal conductivity being at least 0.35 cal/cm. sec. °C.

2. The substrate according to claim 1 having a thermal expansion coefficient substantially the same as that of said semiconductor chip and any materials for the enclosure thereof and having high thermal conductivity.

3. The substrate according to claim 1 wherein said semiconductor chip comprises Si or GaAs.

4. The substrate according to claim 1 wherein said sintering is performed in a hydrogen atmosphere at about 1450° C. to form said substrate.

5. The substrate according to claim 1 wherein said pressing and sintering forms a sintered compact of tungsten and/or molybdenum in a hydrogen atmosphere at about 1000°–1400° C. and said compact is infiltrated with said molten copper in a hydrogen atmosphere at about 1200° C.

6. A substrate for a semiconductor apparatus for loading a semiconductor chip, consisting essentially of a material containing copper and at least one of tungsten and molybdenum, said material being produced by pressing and sintering a uniform mixture of at least one of tungsten and molybdenum powders with not more than 20 weight percent of iron group metal powders to form a sintered compact, said sintered compact being infiltrated with molten copper at 10–30 weight percent, the thermal expansion coefficient of said substrate being in the range of 5.2 to $9.7 \times 10^{-6}$/°C. and thermal conductivity being at least 0.35 cal/cm. sec. °C.

7. The substrate according to claim 6 wherein said iron group element is employed at below 5 wt. %.

8. A package for use in encapsulating a semiconductor device, said package comprising a first member of a ceramic material and a second member of composite material comprising by weight of about 10 to 30% of a copper portion and from about 99 to 70% of a preselected material selected from the group consisting of tungsten and molybdenum in the form of a porous block, said porous block having been impregneated with said copper portion form the molten state of said copper.

* * * * *

Disclaimer 5,086,333 —Mituo Osada; Yoshinari Amano; Nobuo Ogasa; Akira Ohtsuka, all of Itami, Japan. SUBSTRATE FOR SEMICONDUCTOR APPARATUS HAVING A COMPOSITE MATERIAL. Patent dated February 4, 1992. Disclaimer filed April 11, 1995, by the assignee, Sumitomo Electric Industries, Ltd.

Hereby enters this disclaimer to claims 1-7 of said patent.

(*Official Gazette* September 5, 1995.)